United States Patent
Kurimoto

(10) Patent No.: US 10,580,224 B2
(45) Date of Patent: Mar. 3, 2020

(54) SECONDARY BATTERY MANAGEMENT SYSTEM, SECONDARY BATTERY MANAGEMENT APPARATUS, AND SECONDARY BATTERY MANAGEMENT METHOD

(71) Applicant: Yasuhide Kurimoto, Kasugai (JP)

(72) Inventor: Yasuhide Kurimoto, Kasugai (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 38 days.

(21) Appl. No.: 14/778,437

(22) PCT Filed: Mar. 17, 2014

(86) PCT No.: PCT/IB2014/000453
§ 371 (c)(1),
(2) Date: Sep. 18, 2015

(87) PCT Pub. No.: WO2014/147476
PCT Pub. Date: Sep. 25, 2014

(65) Prior Publication Data
US 2016/0275727 A1    Sep. 22, 2016

(30) Foreign Application Priority Data

Mar. 21, 2013   (JP) .................... 2013-057567

(51) Int. Cl.
*G07C 5/00* (2006.01)
*G01R 31/371* (2019.01)
(Continued)

(52) U.S. Cl.
CPC ............. *G07C 5/006* (2013.01); *B60L 3/12* (2013.01); *B60L 58/16* (2019.02); *G01R 31/371* (2019.01);
(Continued)

(58) Field of Classification Search
CPC combination set(s) only.
See application file for complete search history.

(56) References Cited

U.S. PATENT DOCUMENTS 5,525,890 A * 6/1996 Iwatsu ............... G01R 31/3648
320/106
5,744,936 A * 4/1998 Kawakami ........ H01M 10/4207
320/120

(Continued)

FOREIGN PATENT DOCUMENTS

EP          1 786 057 A2    5/2007
JP       2007-141464 A       6/2007
(Continued)

*Primary Examiner* — Adam D Tissot
*Assistant Examiner* — Edward J Pipala
(74) *Attorney, Agent, or Firm* — Sughrue Mion, PLLC

(57) ABSTRACT

A management system (1) includes: a battery information gathering unit (2) that gathers battery information (31), which is information relating to use histories of individual secondary batteries (10); a battery information database (3) that stores the battery information (31) gathered by the battery information gathering unit (2); and an order reception information gathering unit (4) that gathers order reception information (82), which is information relating to component replacement of a secondary battery. The battery information (31) of the secondary battery (10) specified in the order reception information (82) is extracted from the battery information (31) stored in the battery information database (3).

6 Claims, 9 Drawing Sheets

(51) Int. Cl.

| | |
|---|---|
| *G01R 31/382* | (2019.01) |
| *H01M 10/48* | (2006.01) |
| *B60L 3/12* | (2006.01) |
| *B60L 58/16* | (2019.01) |
| *H01M 10/42* | (2006.01) |
| *G07C 5/08* | (2006.01) |

(52) U.S. Cl.
CPC .......... *G01R 31/382* (2019.01); *G07C 5/085* (2013.01); *G07C 5/0808* (2013.01); *H01M 10/425* (2013.01); *H01M 10/4207* (2013.01); *H01M 10/4221* (2013.01); *H01M 10/48* (2013.01); *H01M 10/482* (2013.01); *B60L 2240/545* (2013.01); *B60L 2240/547* (2013.01); *B60L 2240/549* (2013.01); *B60L 2240/70* (2013.01); *B60L 2240/80* (2013.01); *B60L 2260/44* (2013.01); *H01M 2010/4271* (2013.01); *H01M 2010/4278* (2013.01); *H01M 2220/20* (2013.01); *Y02T 10/705* (2013.01); *Y02T 10/7011* (2013.01); *Y02T 10/7291* (2013.01); *Y02T 90/16* (2013.01)

(56) References Cited

U.S. PATENT DOCUMENTS

| | | | | |
|---|---|---|---|---|
| 6,069,468 | A * | 5/2000 | Sonobe | H01M 10/4257 320/106 |
| 2001/0035737 | A1* | 11/2001 | Nakanishi | G01R 31/3624 320/122 |
| 2003/0224241 | A1* | 12/2003 | Takada | H01M 10/425 429/52 |
| 2007/0108946 | A1 | 5/2007 | Yamauchi et al. | |
| 2010/0188039 | A1* | 7/2010 | Yamauchi | H01M 10/42 320/106 |
| 2010/0305792 | A1* | 12/2010 | Wilk | B60K 6/46 701/22 |
| 2013/0030739 | A1* | 1/2013 | Takahashi | G01R 31/3658 702/63 |
| 2013/0090872 | A1 | 4/2013 | Kurimoto | |
| 2013/0200902 | A1* | 8/2013 | Kurimoto | H01M 10/48 324/430 |
| 2014/0046536 | A1* | 2/2014 | Iguchi | G01R 31/3606 701/34.4 |

FOREIGN PATENT DOCUMENTS

| | | |
|---|---|---|
| JP | 2010-212048 A | 9/2010 |
| WO | 2011/162014 A1 | 12/2011 |
| WO | 2012/049852 A1 | 4/2012 |

* cited by examiner

FIG. 3

| INFORMATION TYPE | | ITEM |
|---|---|---|
| (a) BASIC INFORMATION | 1 | VEHICLE SPECIFICATION INFORMATION |
| | 2 | REGION |
| | 3 | DATE |
| | 4 | TOTAL TRAVEL DISTANCE |
| (b) BATTERY INFORMATION | 1 | FULLY CHARGED CAPACITY |
| | 2 | RESISTANCE VALUE |
| | 3 | TIMES ABOVE UPPER LIMIT VOLTAGE |
| (c) OTHER INFORMATION | 1 | BATTERY TEMPERATURE DURING CHARGING |
| CURRENT/VOLTAGE | 2 | TOTAL DISCHARGED ELECTRICITY AMOUNT |
| | 3 | CURRENT RATE |
| | 4 | TIMES BELOW LOWER LIMIT VOLTAGE |
| SOC | 5 | SOC DIFFERENCE |
| | 6 | SOC DISTRIBUTION |
| | 7 | SOC WHEN POWER SUPPLY OFF |
| | 8 | CHARGING AMOUNT DURING CHARGING |

31

SECONDARY BATTERY MANAGEMENT SYSTEM, SECONDARY BATTERY MANAGEMENT APPARATUS, AND SECONDARY BATTERY MANAGEMENT METHOD

BACKGROUND OF THE INVENTION

1. Field of the Invention

The invention relates to a secondary battery management system, a secondary battery management apparatus, and a secondary battery management method for gathering and managing information relating to a secondary battery.

2. Description of Related Art

Hybrid vehicles, electric automobiles, and so on have been developed in recent years in response to environmental concerns. Vehicle secondary batteries installed in these vehicles are used for a longer time than secondary batteries used in other electric appliances. A vehicle secondary battery also tends to be more expensive than secondary batteries used in other electric appliances. Therefore, when the vehicle is to be scrapped, the vehicle is dismantled and the vehicle secondary battery is recovered. Further, when the vehicle secondary battery is replaced after reaching the end of its life or breaking down, the replaced vehicle secondary battery is likewise recovered.

The recovered secondary battery may or, may not be reusable. In a conventional technique, therefore, information relating to individual secondary batteries is gathered and used to manage the secondary batteries. Japanese Patent Application Publication No. 2007-141464 (JP 2007-141464 A), for example, discloses a technique of storing information relating to use histories of individual secondary batteries in an information storage apparatus provided separately to a vehicle, and when a secondary battery is recovered, determining a reuse method of the secondary battery on the basis of the information stored in the information storage apparatus.

The reuse method of a recovered secondary battery is often determined in a store or the like that recovers secondary batteries by associating the recovered secondary battery with the information stored in the information storage apparatus. A case report is received from the store or the like with regard to a secondary battery in which a degree of deterioration of the secondary battery differs from a degree predicted from the information stored in the information storage apparatus and so on, for example. In certain cases, the secondary battery of the case report is collected and analyzed.

However, the related art described above includes the following problem. Case reports are often provided by the store or the like as a whole at intervals of two to three weeks. Hence, when a removed secondary battery is to be collected for analysis after the case report is received, the secondary battery may already have been reused, dismantled, or the like and cannot therefore be collected. When, on the other hand, an attempt is made to predict the need for component replacement of the secondary battery on the basis of the information stored in the information storage apparatus without relying on the case report, a large amount of information must be analyzed, and therefore an excessive load is exerted on the system.

SUMMARY OF THE INVENTION

The invention has been designed to solve the problem in the related art, described above. In other words, the invention provides a technique with which a secondary battery predicted to require component replacement can be dealt with early while suppressing a load on a system.

A secondary battery management system according to an aspect of the invention includes: a use gathering unit configured to gather use information, which is information relating to use histories of individual secondary batteries; a storage apparatus configured to store the use information gathered by the use gathering unit; a replacement gathering unit configured to gather replacement information, which is information relating to component replacement of a secondary battery; and an extraction unit configured to extract the use information of the secondary battery specified in the replacement information from the use information stored in the storage apparatus.

In the secondary battery management system according to this aspect of the invention, the use information gathered by the use gathering unit is stored in the storage apparatus. Further, the replacement information relating to component replacement is gathered by the replacement gathering unit. The extraction unit then extracts the use information of the secondary battery specified in the replacement information from the use information stored in the storage apparatus. Note that the use gathering unit may gather information relating to individual secondary batteries a plurality of times. Further, the use information may be gathered directly from the secondary battery or via a device connected to the secondary battery. Moreover, the replacement information may be information relating to replacement of the entire secondary battery or information relating to replacement of a part of the secondary battery.

With the secondary battery management system according to this aspect of the invention, by obtaining the replacement information, a secondary battery that needs to be replaced can be specified to a certain extent. For example, when the replacement information includes information specifying the secondary battery or information specifying a vehicle in which the secondary battery is installed, the secondary battery can be specified on the basis of this information. Alternatively, when the replacement information includes information indicating a store or the like that performs component replacement on secondary batteries, the secondary battery can be specified to a certain extent on the basis of this information. As a result, the use information of the secondary battery to be replaced can be extracted quickly. Further, by extracting the use information of the secondary battery to be replaced, the use information may be used as a guide to future improvements and the like. In other words, by analyzing the extracted use information, the reason why replacement is required can be investigated. Instead of analyzing a large amount of information, only information extracted in advance need be analyzed, and therefore a load exerted on the system can be suppressed. Furthermore, a case report is not required to extract the use information, and it is therefore likely to be possible to extract the information quickly. As a result, a secondary battery predicted to require component replacement can be dealt with early.

The secondary battery management system disclosed in this specification may further include a determination unit that determines whether or not to recover the secondary battery on the basis of the use information extracted by the extraction unit. By determining whether or not to recover the secondary battery on the basis of the use information, it can be determined to recover a secondary battery that may have deteriorated not only due to use. By analyzing the recovered secondary battery, the reason why component replacement is required can be investigated.

The secondary battery management system disclosed in this specification may also further include a notification unit that issues a collect notification in relation to the secondary battery when the determination unit determines that the secondary battery is to be collected. Secondary battery replacement is often performed in a different location to the secondary battery management system, and therefore, by issuing the collect notification, the secondary battery to be collected can be collected reliably.

Furthermore, the replacement information may include information for specifying an individual secondary battery. By including information for specifying the individual secondary battery, the secondary battery can be specified reliably, and as a result, the use information can be extracted from the replacement information easily.

Moreover, the replacement information may include information for specifying a vehicle in which the secondary battery is installed. By including information for specifying the vehicle in which the secondary battery is installed, it is likely to be possible to specify the vehicle. Hence, the installed secondary battery can be specified substantially reliably, and as a result, the use information can be extracted from the replacement information easily.

Further, the replacement information may include information for specifying at least one of an order date and an order source of the component replacement. By including information for specifying at least one of the order date and the order source of the component replacement, the corresponding vehicle can be narrowed down considerably. In other words, the installed secondary battery can be specified to a certain extent, and as a result, the use information can be extracted from the replacement information easily.

This specification further discloses a secondary battery management apparatus including a storage unit and a control unit, wherein the control unit is configured to: obtain use information, which is information relating to use histories of individual secondary batteries; execute use acquisition processing to store the use information in the storage unit; execute replacement acquisition processing to obtain replacement information, which is information relating to component replacement of a secondary battery; and execute extraction processing to extract the use information of the secondary battery specified in the replacement information from the use information stored in the storage unit.

Furthermore, in a secondary battery management method disclosed in this specification, use information, which is information relating to use histories of individual secondary batteries, is gathered, the gathered use information is stored in a storage apparatus, replacement information, which is information relating to component replacement of a secondary battery, is gathered, and the use information of the secondary battery specified in the replacement information is, extracted from the use information stored in the storage apparatus.

With the secondary battery management system, secondary battery management apparatus, and secondary battery management method according to this aspect of the invention, a secondary battery predicted to require component replacement can be dealt with early while suppressing a load on a system.

BRIEF DESCRIPTION OF THE DRAWINGS

Features, advantages, and technical and industrial significance of exemplary embodiments of the invention will be described below with reference to the accompanying drawings, in which like numerals denote like elements, and wherein:

FIG. 3 is an illustrative view showing an example of battery information;

DETAILED DESCRIPTION OF EMBODIMENTS

A specific embodiment of the invention will be described in detail below with reference to the attached drawings. In this embodiment, the invention is applied to a system for managing a secondary battery installed in a vehicle.

[System Outline]

Figure 1:
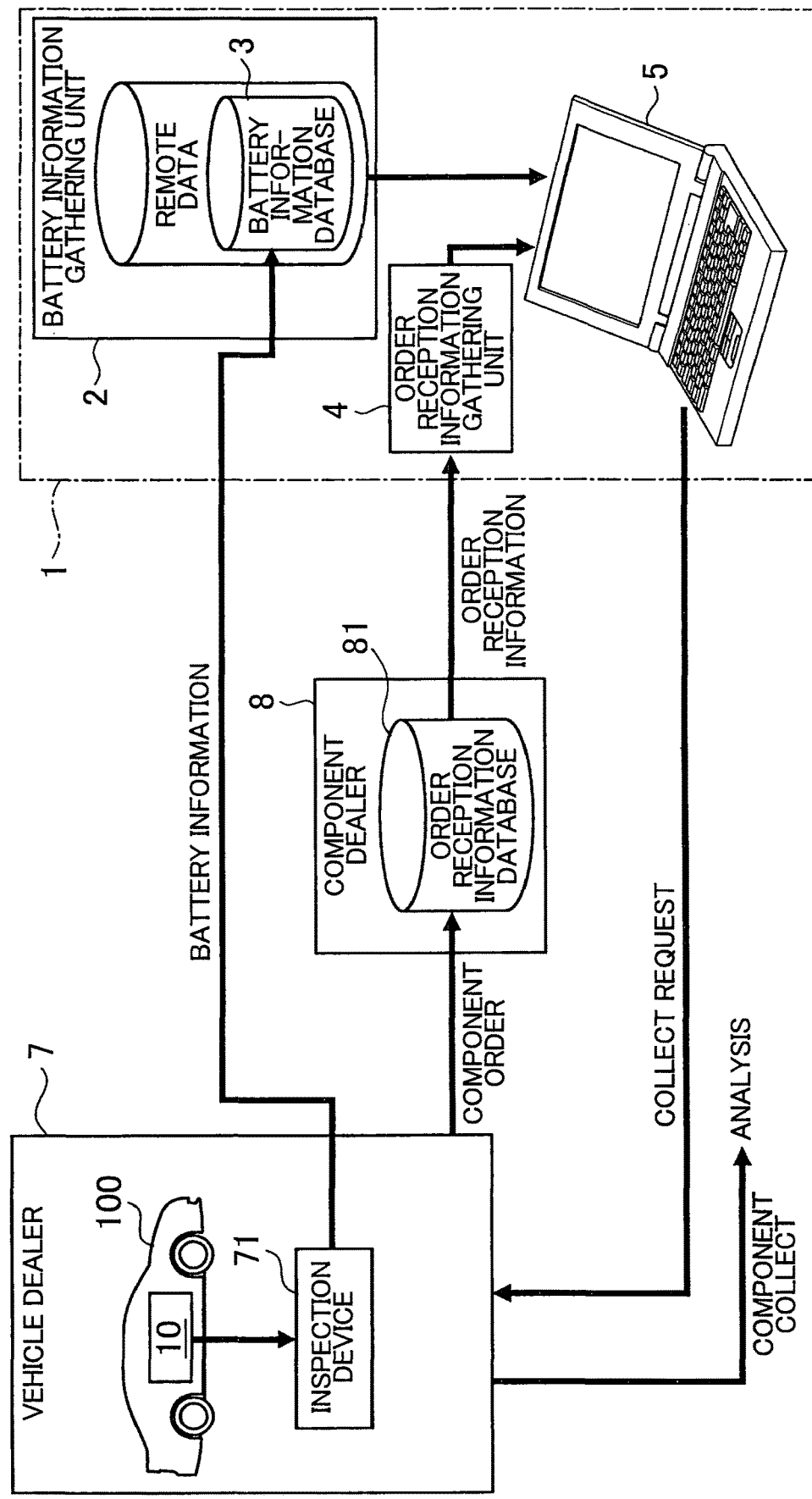
FIG. 1 is a block diagram illustrating a management system according to an embodiment.

As shown in FIG. 1, a management system 1 according to this embodiment is a system for managing a secondary battery 10 installed in a vehicle 100. The management system 1 includes a battery information gathering unit 2, a battery information database 3, an order reception information gathering unit 4, and a management unit 5. The management system 1 gathers information from a vehicle dealer 7 that sells and services the vehicle 100, and a component dealer 8 that supplies components to the vehicle dealer 7. The vehicle dealer 7 includes an inspection device 71 for inspecting the secondary battery 10. The component dealer 8 includes an order reception information database 81 relating to component sales.

The battery information gathering unit 2 gathers battery information 31 (see FIG. 3), which is information relating to a use history of the secondary battery 10 installed in the vehicle 100, and stores the gathered battery information 31 in the battery information database 3. Data stored in the battery information 31 will be described in detail below. For example, the battery information gathering unit 2 gathers the battery information 31 in relation to the inspected secondary battery 10 from the inspection device 71 of the vehicle dealer 7. The battery information gathering unit 2 is an example of use gathering means.

The battery information database 3 stores the battery information 31 gathered by the battery information gathering unit 2. Note that individual identification information is attached to the secondary battery 10, and the battery information 31 is stored in the battery information database 3 in association with the identification information of the secondary battery 10. The battery information database 3 is an example of a storage apparatus.

The order reception information gathering unit 4 gathers order reception information 82 (see FIG. 4), which is information relating to a component order for the secondary battery 10, from the component dealer 8, and stores the order reception information 82 in the order reception information database 81. Data stored in the order reception information 82 will be described in detail below. When a component order is received from the vehicle dealer 7, the component dealer 8 gathers information relating to the order as the order reception information 82. Note that the order reception information gathering unit 4 receives the order reception information 82 from the component dealer 8 every time the component dealer 8 receives an order. The order reception information gathering unit 4 is an example of replacement gathering means.

The management unit 5 is realized by a personal computer, for example. The management unit 5 extracts the secondary battery 10 to be replaced from the battery information 31 gathered by the battery information gathering unit 2 and the order reception information 82 gathered by the order reception information gathering unit 4. Further, the management unit 5 determines whether or not to collect the extracted secondary battery 10. After determining that the secondary battery 10 is to be collected, the management unit 5 notifies the vehicle dealer 7 that the secondary battery 10 is to be collected. The management unit 5 is an example of extracting means, determining means, and notifying means.

[Secondary Battery]

Figure 2:
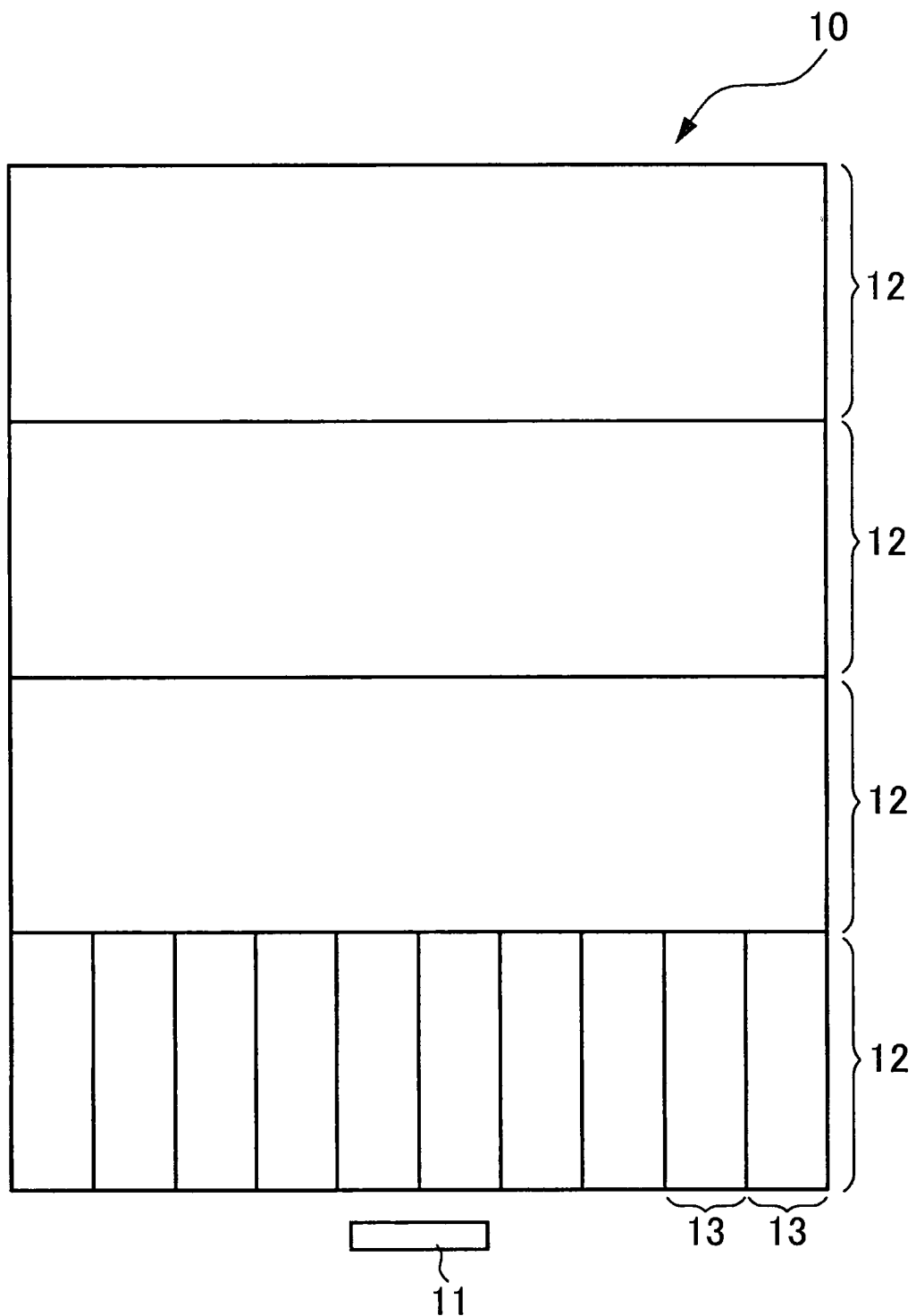
FIG. 2 is a schematic view illustrating a configuration of a secondary battery.

Next, the secondary battery 10 managed by the management system 1 according to this embodiment will be described briefly. As shown in FIG. 2, for example, the secondary battery 10 includes a tag 11 and a plurality of cell stacks 12. Each cell stack 12 is formed by bundling a plurality of battery cells 13 in series in a single row. Note that the number of cell stacks 12 included in the secondary battery 10 and the number of battery cells 13 included in each cell stack 12 are not limited to the example in the drawing. Further, the secondary battery according to the invention is not limited to the entire secondary battery 10 including the cell stacks 12, and may denote the cell stack 12 or the battery cell 13 forming a part of the secondary battery 10.

Each battery cell 13 is a conventional lithium ion secondary battery, for example, which deteriorates over time, as a result of repeated charging and discharging, and so on. However, the degree of advancement of the deterioration differs according to a storage condition, a use method, and so on. In other words, a deterioration condition of the secondary battery 10 cannot be determined simply from a number of days following manufacture and a travel distance of the vehicle 100. Hence, the condition of the secondary battery 10 is inspected during servicing of the vehicle using the dedicated inspection device 71 (see FIG. 1).

The tag 11 is a storage member storing identification information, which is information specifying the secondary battery 10. The inspection device 71 reads the identification information of the connected secondary battery 10 from the tag 11. The inspection device 71 then associates the battery information 31, which is obtained during the inspection, with the read identification information, and transmits the result to the battery information gathering unit 2. Note that the identification information is provided not only in units of the secondary battery 10, but also at least for each of the individual cell stacks 12 included therein. The identification information may also be provided in units of the battery cells 13.

A writable storage member may be used as the tag 11. A control computer of the vehicle 100 may write information relating to the condition of the secondary battery 10 to the tag 11 appropriately. A use history of the battery and information relating to a charging/discharging condition of the battery, for example, are written to the tag 11. In this case, for example, the inspection device 71 can obtain information relating to the secondary battery 10 from a time other than during the inspection by reading the information from the tag 11. Furthermore, the inspection device 71 can transmit the obtained past information to the battery information gathering unit 2 together with the information that is valid at the time of the inspection.

[Outline of Battery Information]

The battery information 31 of the secondary battery 10 is information indicating the Use history and the current deterioration condition of the individual secondary battery 10. As shown in FIG. 3, for example, the battery information 31 includes basic information relating to the vehicle 100, battery information relating to the lifespan of the secondary battery 10, and other information relating to the use method of the secondary battery 10.

The basic information includes vehicle specification information specifying the vehicle 100, and information such as a geographical area in which the vehicle 100 is mainly used, a date on which newest information was obtained, and a total travel distance at that time. The vehicle specification information is information identifying each individual vehicle 100, such as a frame number of the vehicle 100, for example. By specifying the vehicle 100, the secondary battery 10 is also substantially specified. Note that a plurality of battery information 31 having different dates is stored in the battery information database 3 for each secondary battery 10.

The battery information includes information such as a fully charged capacity and a resistance value of the secondary battery 10. This information serves as material for determining the degree of deterioration of the secondary battery 10 at that point in time. For example, a determination as to whether or not the secondary battery 10 has reached the end of its life is made by the vehicle dealer 7 on the basis of this information.

The other information is mainly information relating to the use method of the secondary battery 10. The other information includes, for example, information indicating a total amount of discharged electricity, a state of charge (SOC) when a power supply is OFF, a battery temperature during charging, a current rate, an SOC difference, an SOC distribution, a charging amount during charging, and an air temperature and the battery temperature during a period of non-use. In addition to the information shown in FIG. 3, the other information may include an elapsed time following the start of use, a battery use time, a battery temperature during ignition-ON, a battery temperature during operation, a battery temperature during driving, and so on.

[Outline of Order Reception Information]

Figure 4:
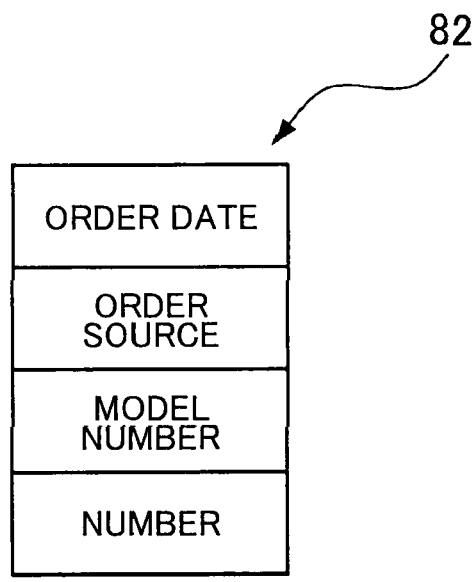
FIG. 4 is an illustrative view showing an example of order reception information.

As shown in FIG. 4, for example, the order reception information 82 of the secondary battery 10 includes information indicating an order date, an order source, a model number of the ordered component, and a number. The order date is information indicating the date on which the component was ordered. The order source is information specifying the vehicle dealer 7 that placed the order. The model number is information specifying the ordered component. The number is the number of ordered components.

Note that the order source information of the order reception information 82 does not have to be information directly indicating the vehicle dealer 7 serving as the order source. When, for example, a middleman exists between the vehicle dealer 7 that performs inspection and component replacement operations on the secondary battery 10 and the component dealer 8, the order source information may be information indicating the middleman. Alternatively, the order source information may be information indicating a group of a plurality of vehicle dealers 7. Further, the model number is not limited to information indicating the model number of the ordered component itself, and may be information indicating a vehicle type of the vehicle 100 in which the ordered component is to be installed, for example.

The order reception information 82 preferably includes identification information by which to identify the secondary battery 10 in which the ordered component is to be replaced. The order reception information 82 more preferably includes vehicle specification information by which to specify the vehicle 100 in which the replacement subject secondary battery 10 is installed. Alternatively, the order reception information 82 may include information serving as a hint from which to estimate the vehicle 100.

[Management Processing]

Figure 5:
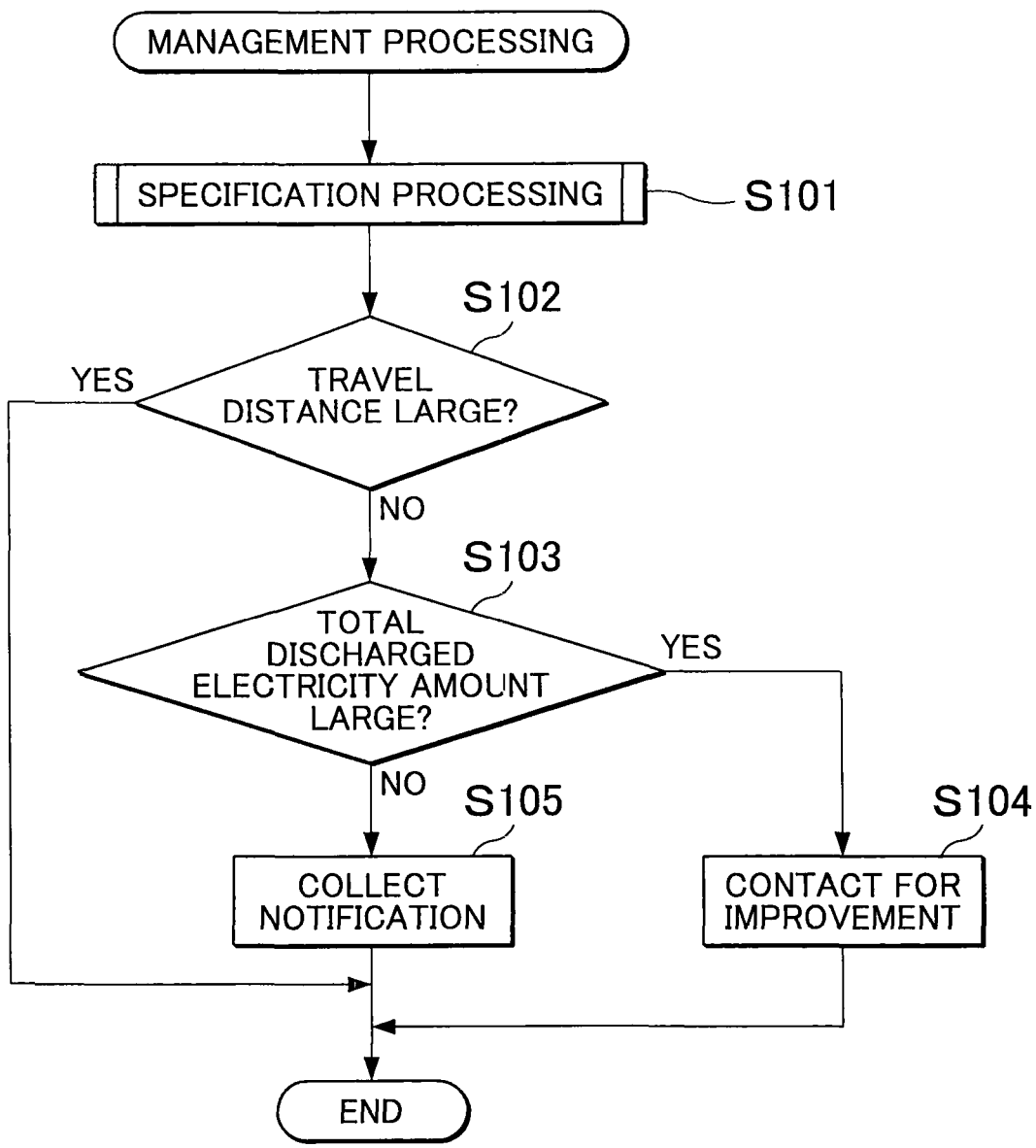
FIG. 5 is a flowchart showing procedures of management processing.

Next, procedures of management processing executed in the management system 1 according to this embodiment will be described with reference to a flowchart shown in FIG. 5. The management processing according to this embodiment is executed by the management unit 5 when the order reception information gathering unit 4 receives the order reception information 82 from the component dealer 8.

Figure 6:
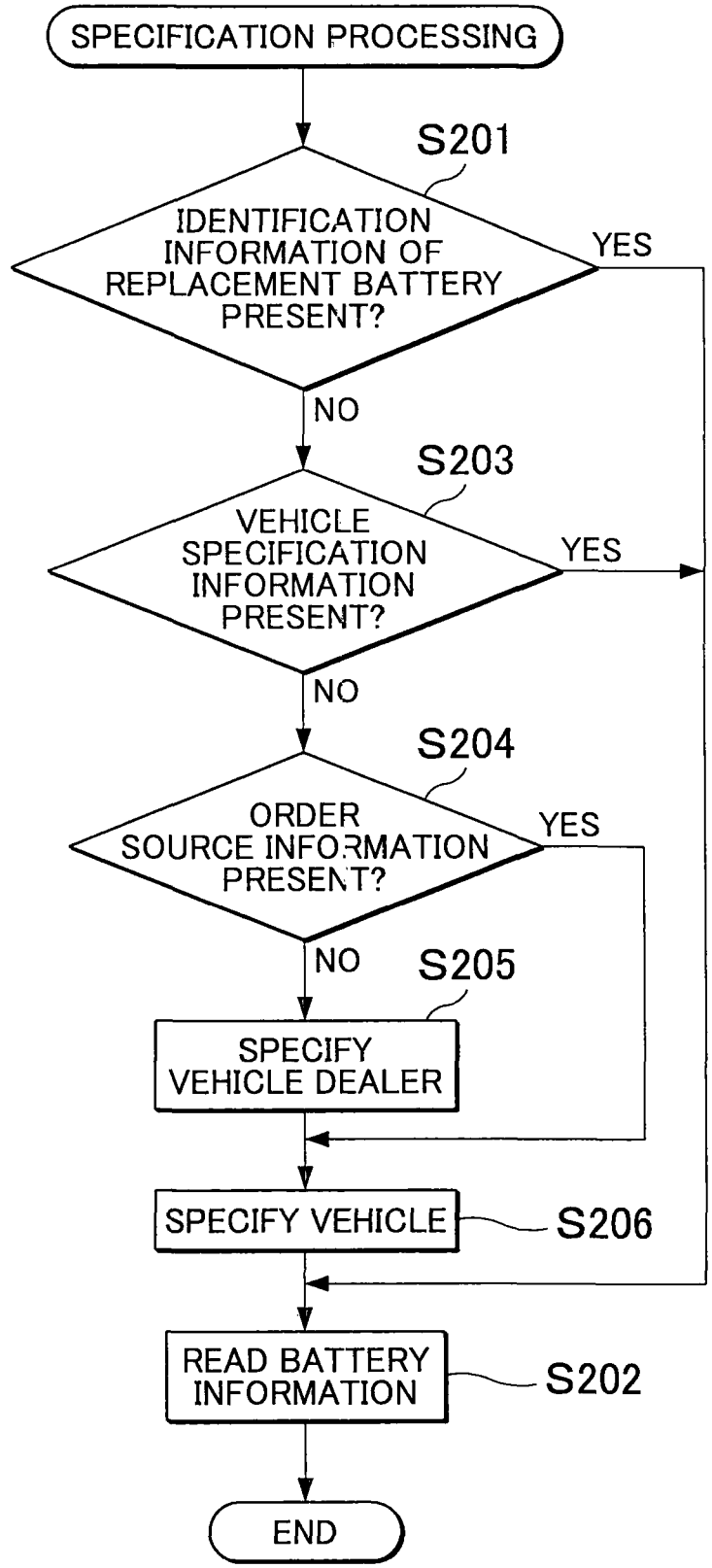
FIG. 6 is a flowchart showing procedures of specification processing.

When execution of the processing begins, first, specification processing is executed to specify the replacement subject secondary battery 10 from the received order reception information 82 (S101). Hereafter, the replacement subject secondary battery 10 will be referred to as the replacement battery 10. Procedures of the specification processing will be described with reference to a flowchart shown in FIG. 6. The specification processing is processing for specifying the replacement battery 10 and reading the battery information 31 thereof.

When execution of the specification processing begins, first, the management unit 5 determines whether or not the order reception information 82 includes the identification information of the replacement battery 10 (S201). When the identification information is included (S201: Yes), the battery information 31 is read from the battery information database 3 on the basis of the identification information (S202). The specification processing is then terminated.

When the order reception information 82 does not include the identification information of the replacement battery 10 (S201: No), a determination is made as to whether or not the order reception information 82 includes the specification information of the vehicle 100 (S203). When the specification information is included (S203: Yes), the identification information of the secondary battery 10 can be specified on the basis of the specification information. Accordingly, the battery information 31 is read from the battery information database 3 on the basis of the identification information (S202). The specification processing is then terminated.

When the order reception information 82 does not include the specification information of the vehicle 100 (S203: No), a determination is made as to whether or not the order reception information 82 includes information indicating the vehicle dealer 7 as the order source (S204). When information indicating the vehicle dealer 7 is not included as the order source (S204: No), the vehicle dealer 7 is specified from among order source subject stores (S205). Furthermore, the vehicle 100 is specified from among vehicles 100 serviced at the vehicle dealer 7 (S206). The secondary battery 10 of the specified vehicle 100 is then specified as the replacement battery 10, whereupon the battery information 31 thereof is read from the battery information database 3 (S202). The specification processing is then terminated.

When, on the other hand, information indicating the vehicle dealer 7 is included as the order source (S204: Yes), the vehicle 100 installed with the ordered component is specified from among the vehicles 100 inspected by the inspection device 71 at the vehicle dealer 7 prior to the order date (S206). The secondary battery 10 of the specified vehicle 100 is then specified as the replacement battery 10, whereupon the battery information 31 thereof is read from the battery information database 3 (S202). The specification processing is then terminated.

Depending on the precision of the order reception information 82, it may ultimately be impossible to specify a single vehicle 100. In this case, the battery information 31 of the plurality of vehicles 100 remaining as candidates may be read.

Returning to FIG. 5, when the specification processing of S101 is complete, a determination as to whether or not the vehicle 100 has a large total travel distance is made from the extracted battery information 31 (S102). When a large amount of time has passed following manufacture of the replacement battery 10 or the total travel distance of the vehicle 100 is large, for example, the secondary battery 10 may be estimated to have reached the end of its life appropriately due to use. In this case, it is determined that further analysis is unnecessary (S102: Yes), and the management processing is terminated.

When it is determined that the total travel distance of the vehicle 100 installed with the replacement battery 10 is not so large (S102: No), on the other hand, the total amount of electricity discharged from the replacement battery 10 is obtained from the battery information 31. A determination is then made as to whether or not the total discharged electricity amount is large (S103).

Figure 7:
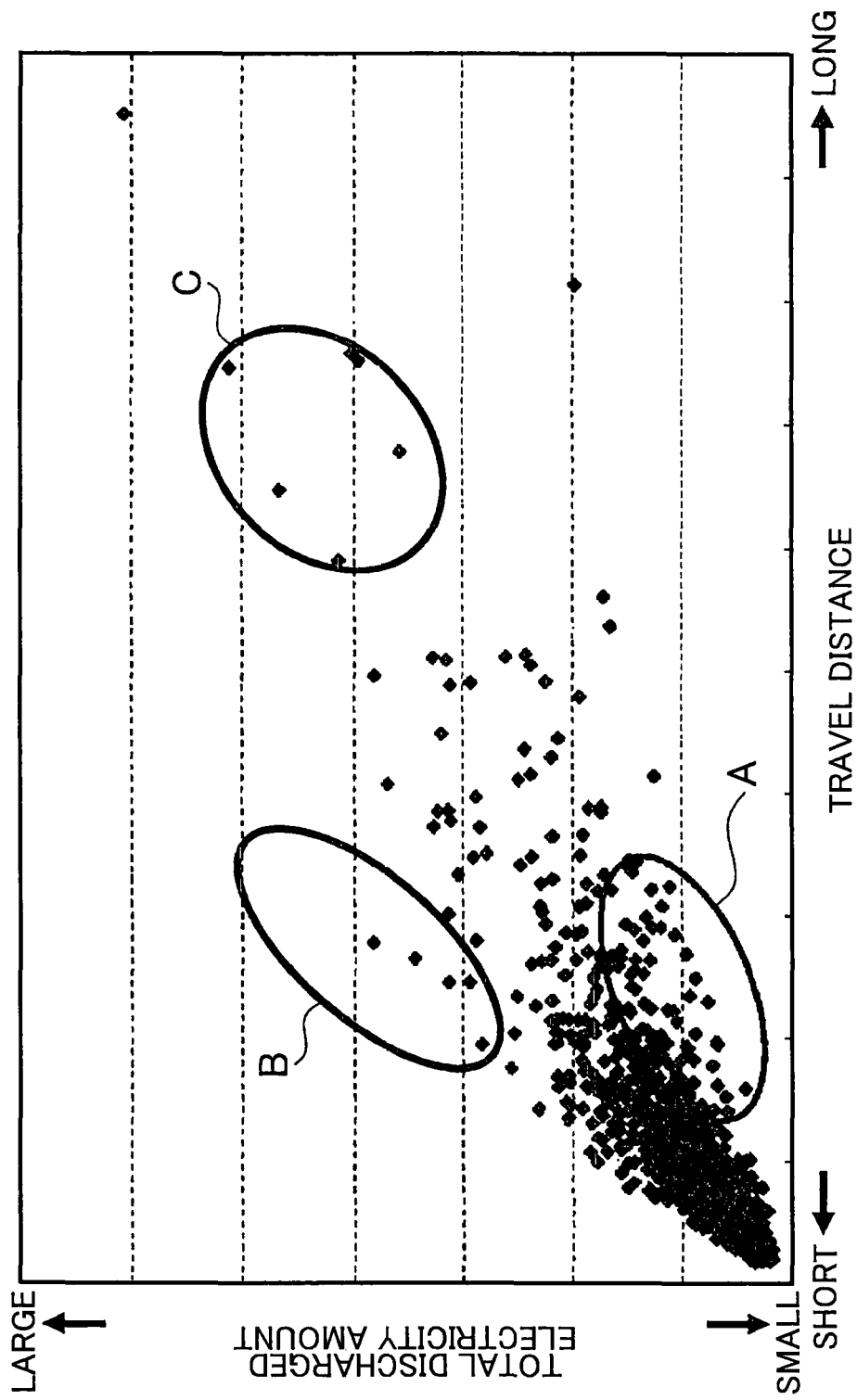
FIG. 7 is a distribution diagram showing an example of a relationship between a travel distance and a total discharged electricity amount.

As shown in FIG. 7, for example, a relationship between the travel distance of the vehicle 100 and the total discharged electricity amount of the secondary battery 10 installed therein is distributed over a certain range. Within this range, a region A, for example, is a region in which the total discharged electricity amount is small relative to the travel distance. It may be estimated that the secondary batteries 10 distributed within the region A are used conservatively. A region B, meanwhile, is a region in which the total discharged electricity amount is large relative to the travel distance. It may be estimated that the secondary batteries 10 distributed within the region B are used rigorously enough to shorten the lifespan of the secondary battery 10.

Further, a region C is a region in which both the travel distance and the total discharged electricity amount are large. It may be estimated that deterioration of the secondary batteries 10 distributed within the region C has advanced due to use such that the secondary batteries 10 are approaching the end of their lifespans. Hence, when the replacement battery 10 corresponds to the region C, Yes is determined in S102. In this case, further analysis of the replacement battery 10 is unnecessary.

When the replacement battery 10 corresponds to the region B, on the other hand, it is estimated that the use method employed by an owner of the vehicle 100 may cause a reduction in the lifespan of the secondary battery 10. For example, the owner may employ rapid acceleration and rapid deceleration frequently when driving. In this case, the vehicle dealer 7 is preferably contacted and prompted to provide the owner with information for improving the use method (S104). When the battery information 31 of the replacement battery 10 corresponds to the region B, the management processing is terminated after S104.

Figure 8:
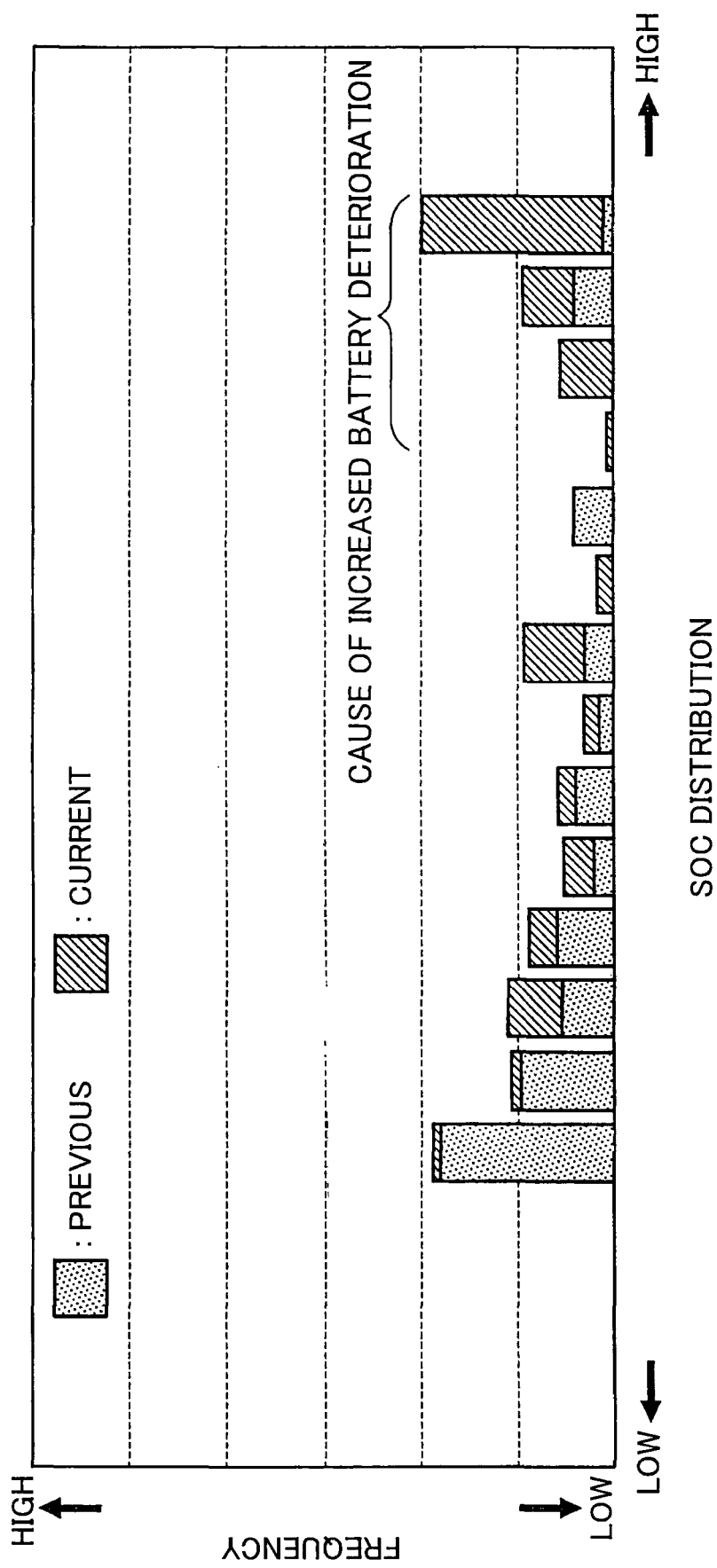
FIG. 8 is a graph showing an example of variation in a use condition of the secondary battery.

Deterioration of the secondary battery 10 increases not only due to frequent use of rapid acceleration and rapid deceleration while driving, but also when the secondary battery 10 is stored in a high SOC condition. In an example shown in FIG. 8, for example, the frequency of a high SOC condition is greater in current battery information 31 than previous battery information 31. Conventionally, when the secondary battery 10 is stored for a long time in a high SOC condition, deterioration advances more quickly. Hence, likewise when this use method is employed, the vehicle dealer 7 is preferably contacted and prompted to provide the owner with information for improving the use method.

When the total discharged electricity amount of the replacement battery 10 is not large (S103: No), on the other hand, further analysis is required. In this case, the replacement battery 10 corresponds to the region A in FIG. 7. In other words, it is estimated that replacement is required even though the replacement battery 10 has not reached the end of its life appropriately and there is no problem in the use method. Accordingly, it is desirable to investigate the reason why the replacement battery 10 has deteriorated to the extent that replacement is required in further detail. Hence, a collect notification is issued to the vehicle dealer 7 (S105) to request collection of the replacement battery 10. A technician can then analyze the collected replacement battery 10 to obtain more detailed information. Following S105, the management processing is terminated.

In this embodiment, after the order reception information 82 is received, the battery information 31 is extracted from the battery information database 3 on the basis of the received order reception information 82. The extracted battery information 31 is then analyzed to determine whether or not to collect the replacement battery 10. In other words, there is no need to analyze a large amount of information, and therefore an excessive load is not exerted on the management system 1. Furthermore, there is no need to wait for a case report from the vehicle dealer 7, and therefore the collect notification can be issued within a short time of approximately one day, for example, after determining that the replacement battery 10 is to be replaced. Hence, the notification can be issued before the secondary battery 10 is reused, handed over to a trader, or the like, and it is therefore more likely to be possible to collect and analyze the removed secondary battery 10 in its current condition. As a result, causes can be investigated and countermeasures can be implemented early.

Note that when the secondary battery 10 is replaced, the identification information of the secondary battery 10 installed in the vehicle 100 changes. At this time, the relationship between the vehicle 100 and the secondary battery 10 is preferably reset such that the battery information 31 of the newly attached secondary battery 10 is overwritten onto the battery information 31 of the removed secondary battery 10. In so doing, it is possible to prevent the battery information 31 of the removed secondary battery 10 from being lost. Further, measures may be taken to ensure that when the vehicle is scrapped or sold, the battery information 31 of the installed secondary battery 10 can be obtained by a second hand car dealer or the like. Since the degree of deterioration and a reusable range of the secondary battery 10 can be predicted on the basis of the battery information 31, this information may also be reflected in a buy-back price or a retail price, for example.

[Application of Analysis Result]

When the collect notification is issued (S105 in FIG. 5) in relation to the secondary battery 10 during the management processing, the secondary battery 10 is collected by the vehicle dealer 7 and sent to a collect destination. In the collect destination, the secondary battery 10 is analyzed in detail by a technician. A result of the analysis is applied to subsequent manufacturing, development, and distribution management of the secondary battery 10.

For example, when it is learned that a plurality of similar replacement cases have occurred in a fixed region, an instruction may be issued to perform early inspections on other vehicles in the region. Alternatively, the vehicle dealers 7 in the region may be notified that similar cases may occur. Alternatively, a further investigation may be performed to determine whether or not unique circumstances exist in the region.

Furthermore, when it is learned that a plurality of similar replacement cases have occurred in a fixed lot of products, for example, an investigation is preferably performed into the manufacturing conditions of the lot. Then, depending on the result of the investigation, the other secondary batteries 10 in the lot may be collected. In so doing, a secondary battery 10 that is predicted to deteriorate more quickly than normal can be identified before the need for component replacement, and therefore the secondary battery 10 can be dealt with early.

With the management system 1 according to this embodiment, as described in detail above, the battery information 31 of the secondary battery 10 is gathered by the battery information gathering unit 2, and the gathered battery information 31 is stored in the battery information database 3. Further, when an order is received for a replacement component of the secondary battery 10, the order reception information 82 is received by the order reception information gathering unit 4. The management unit 5 specifies the replacement battery 10 from the received order reception information 82, and extracts the battery information 31 of the specified replacement battery 10. In other words, the extracted battery information 31 is the battery information 31 of the secondary battery 10 specified from the order reception information 82, and therefore the load exerted on the system can be suppressed. Furthermore, by analyzing the extracted battery information 31, it is likely to be possible to estimate the reason why the secondary battery 10 needs to be replaced. Depending on the reason for replacement, similar cases of component replacement in other secondary batteries 10 can be predicted, and as a result, countermeasures can be implemented early.

Note that this embodiment is merely an example, and the invention is not limited thereto. Needless to mention, various amendments and modifications may be implemented on the invention within a scope that does not depart from the spirit thereof.

For example, the invention is not limited to a lithium ion secondary battery, and various chargeable/dischargeable secondary batteries may be applied. Further, the secondary battery 10 is not limited to a battery installed in the vehicle 100 as long as the battery information 31 can be gathered therefrom.

Furthermore, for example, the transmission source from which the battery information 31 is transmitted to the battery information gathering unit 2 is not limited to the inspection device 71, and may be an external charger having a communication function. According to this configuration, when the secondary battery 10 is connected to the external charger having a communication function, the battery information 31 of the secondary battery 10 is transmitted to the battery information gathering unit 2. Further, for example, when the vehicle 100 itself has a communication function, the battery information 31 may be transmitted, periodically to the battery information gathering unit 2 directly from the vehicle 100.

Figure 9:
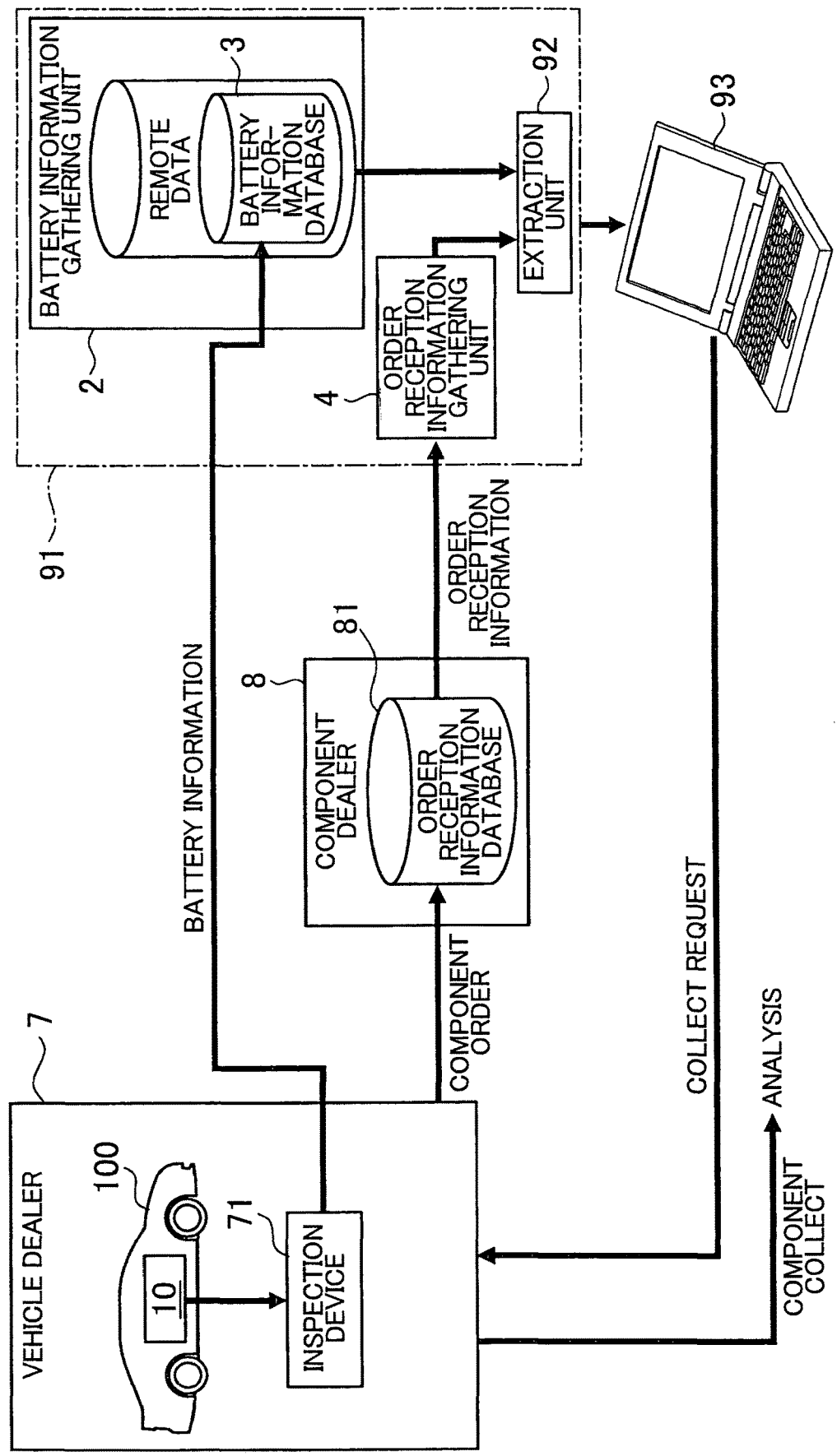
FIG. 9 is a block diagram illustrating another example of a management system.

Furthermore, as shown in FIG. 9, for example, a management system 91 having an extraction unit 92 that does not include determining means and notifying means may be provided instead of the management unit 5. The extraction unit 92 performs only the specification processing (see FIG. 6), to extract the battery information 31 of the replacement battery 10 on the basis of the order reception information 82 received by the order reception information gathering unit 4. The extraction unit 92 does not determine whether or not to collect the secondary battery 10, and does not issue the collect notification and so on when it is determined that the secondary battery 10 is to be collected. In this case, the processing of S102 onward in FIG. 5 may be performed by a determination unit 93 constructed on the exterior of the management system 91. Here, the management system 91 hands over the battery information 31 extracted by the extraction unit 92 to the determination unit 93.

The invention claimed is:

1. A secondary battery management system comprising:
a processor configured to gather use information, which is information comprising use histories of individual secondary batteries, wherein the use information comprises a total amount of electricity discharged by a secondary battery and a distance traveled by a vehicle in which the secondary battery is installed; and
a storage configured to store the use information gathered by the processor,
wherein the processor is further configured to gather replacement information, and wherein the replacement information comprises:
information relating to component replacement of the secondary battery,
information specifying an order date, and
information specifying an order source that places an order for the component replacement,
wherein the processor is further configured to extract the use information of the secondary battery specified in the replacement information from the use information stored in the storage,
wherein the processor is further configured to determine if further analysis of the secondary battery is required based on a relationship between the total amount of electricity discharged by the secondary battery and the distance traveled by the vehicle,
wherein the processor is further configured to determine that the secondary battery should be collected if further analysis is required, and
wherein the processor is further configured to issue a collect notification to the order source in relation to the secondary battery when the processor determines that the secondary battery should be collected if further analysis is required based on the relationship between the total amount of electricity discharged by the secondary battery and the distance traveled by the vehicle.

2. The secondary battery management system according to claim 1, wherein the replacement information comprises information for specifying the secondary battery individually.

3. The secondary battery management system according to claim 1, wherein the replacement information comprises information for specifying a vehicle in which the secondary battery is installed.

4. A secondary battery management apparatus comprising:
a storage; and
a controller, wherein the controller is configured to:
obtain use information, which is information comprising use histories of individual secondary batteries, wherein the use information comprises a total amount of electricity discharged by a secondary battery and a distance traveled by a vehicle in which the secondary battery is installed;
execute use acquisition processing to store the use information in the storage;
execute replacement acquisition processing to obtain replacement information, wherein the replacement information comprises information relating to component replacement of a secondary battery, information specifying an order date, and information specifying an order source that places an order for the component replacement; and
execute extraction processing to extract the use information on the secondary battery specified in the replacement information from the use information stored in the storage;
determine whether further analysis of the secondary battery is required based on a relationship between the total amount of electricity discharged by the secondary battery and the distance traveled by the vehicle;
determine that the secondary battery should be collected if further analysis is required; and
issue a collect notification to the order source in relation to the secondary battery when the controller determines that the secondary battery should be collected if further analysis is required based on the relationship between the total amount of electricity discharged by the secondary battery and the distance traveled by the vehicle.

5. A secondary battery management method comprising:
gathering use information, which is information comprising use histories of individual secondary batteries, wherein the use information comprises a total amount of electricity discharged by a secondary battery and a distance traveled by a vehicle in which the secondary battery is installed;
storing the gathered use information in a storage apparatus; and
extracting the use information on a secondary battery specified in replacement information, wherein the replacement information comprises information gathered by the storage apparatus in relation to component replacement of the secondary battery, information specifying an order date, and information specifying an order source that places an order for the component replacement, from the use information stored in the storage apparatus;
determining that further analysis of the secondary battery is required based on a relationship between the total amount of electricity discharged by a secondary battery and the distance traveled by the vehicle;
determining that the secondary battery should be collected; and
issuing a collect notification to the order source for the secondary battery after it is determined that the secondary battery should be collected based on the relationship between the total amount of electricity discharged by the secondary battery and the distance traveled by the vehicle.

6. A secondary battery management method comprising:
gathering use information, which is information comprising use histories of individual secondary batteries, wherein the use information comprises a total amount of electricity discharged by a secondary battery and a distance traveled by a vehicle in which the secondary battery is installed;
storing the gathered use information in a storage apparatus; and
extracting the use information on a secondary battery specified in replacement information, wherein the replacement information comprises information gathered by the storage apparatus in relation to component replacement of the secondary battery, information specifying an order date, and information specifying an order source that places an order for the component replacement, from the use information stored in the storage apparatus;
determining that further analysis of the secondary battery is required based on a relationship between the total amount of electricity discharged by a secondary battery and the distance traveled by the vehicle;
determining that the secondary battery should be collected; and
issuing a collect notification to the order source with instructions to retain the secondary battery after it is determined that the secondary battery should be collected based on the relationship between the total amount of electricity discharged by the secondary battery and the distance traveled by the vehicle.

* * * * *